United States Patent [19]

Nakao et al.

[11] Patent Number: 4,943,235
[45] Date of Patent: Jul. 24, 1990

[54] HEAT-TREATING APPARATUS

[75] Inventors: Ken Nakao, Sagamihara; Seishiro Sato, Machida; Wataru Ohkase, Sagamihara, all of Japan

[73] Assignee: Tel Sagami Limited, Kanagawa, Japan

[21] Appl. No.: 275,966

[22] Filed: Nov. 25, 1988

[30] Foreign Application Priority Data

Nov. 27, 1987 [JP] Japan ................................ 62-299228
Dec. 30, 1987 [JP] Japan ................................ 62-334098

[51] Int. Cl.⁵ .......................... F27D 3/12; F27B 5/04
[52] U.S. Cl. .................................. 432/205; 432/241; 432/242; 432/6
[58] Field of Search ............... 432/241, 205, 206, 242, 432/123, 220

[56] References Cited

U.S. PATENT DOCUMENTS

| | | | |
|---|---|---|---|
| 4,596,526 | 6/1986 | Soliman | 432/205 |
| 4,610,628 | 9/1986 | Mizushina | 432/241 |
| 4,613,305 | 9/1986 | Sakurai | 432/6 |
| 4,738,618 | 4/1988 | Massey et al. | 432/241 |
| 4,775,317 | 10/1988 | Schulke et al. | 432/241 |

Primary Examiner—Henry C. Yuen
Attorney, Agent, or Firm—Oblon, Spivak, McClelland, Maier & Neustadt

[57] ABSTRACT

A heat-treating apparatus comprises a heat-treating furnace which include a process tube arranged so as to set its longitudinal direction vertically and having inlet and exhaust ports for a reaction gas, a heater arranged around the process tube, a capping member for capping an opening for allowing an heat-treating object to be loaded therethrough, which is formed in the lower end of the process tube, a case for covering a portion between the process tube and the capping member, and an exhaust nozzle, coupled to the the exhaust port formed in the process tube, for introducing the exhaust waste gas to the outside of the heat-treating apparatus. An exhaust nozzle is arranged in the case so as to introduce the waste gas leaking from between the process tube and the capping member to the outside of the heat-treating apparatus, thereby preventing the leaked gas from being diffused around the heat-treating apparatus.

10 Claims, 4 Drawing Sheets

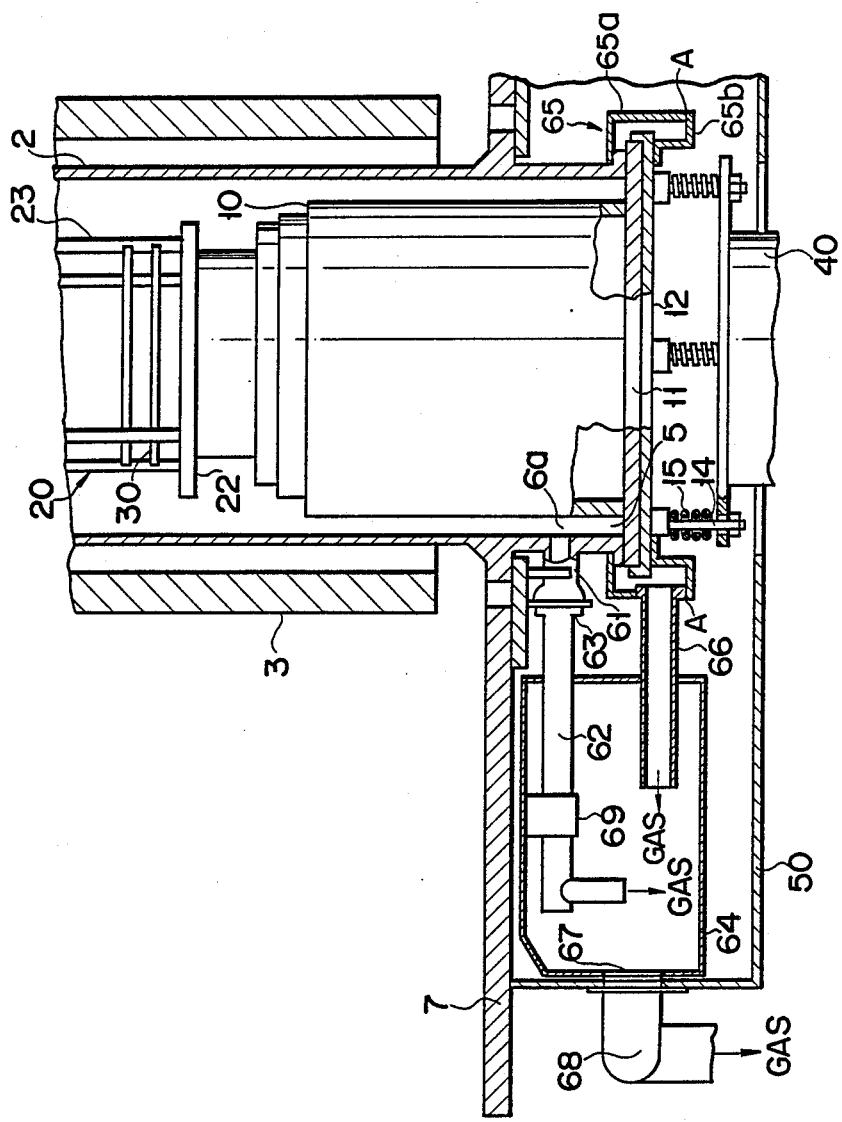
F I G. 3

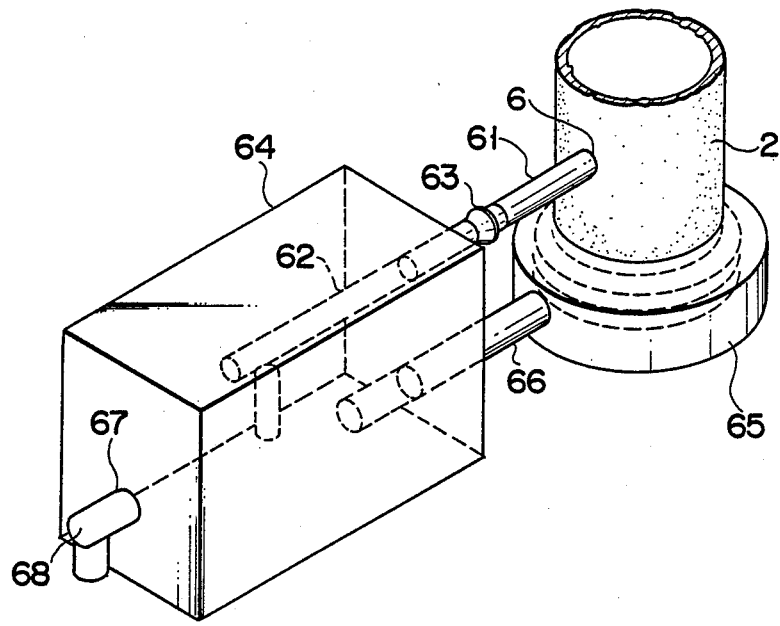
F I G. 4

HEAT-TREATING APPARATUS

BACKGROUND OF THE INVENTION

1. Field of the Invention

The present invention relates to a heat-treating apparatus for heat-treating objects to be heat-treated such as semiconductor wafers for oxidation, diffusion, or the like. For example, diffusion apparatus is used as such an apparatus.

2. Description of the Related Art

When, for example, semiconductor wafers are heat-treated for oxidation, diffusion, or the like, a plurality of semiconductor wafers are mounted on a quartz boat, and the boat is loaded into an heat-treating furnace, thereby performing an heat-treating process.

Such an heat-treating apparatus comprises a process tube made of a heat-resistant material such as quartz, and a heater arranged outside the process tube. An opening is formed in one end of the process tube. The boat mounting the wafers thereon is loaded from the opening into the process tube. While a gas required for heat-treating is introduced in the process tube, a power is supplied to the heater so as to heat-treat the wafers. In this heat-treating, in order to prevent the gas fed into the process tube from leaking out, the opening is capped with a proper member.

In heat-treating, since the process tube is heated to a temperature as high as 1,100° C., and this capping member is also heated to a high temperature, the capping member is made of the same heat-resistant material, e.g., quartz, as that of the process tube.

In addition, various parts for loading/unloading objects to be heat-treated are arranged around the heat-treating furnace. The heat-treating apparatus is constituted by these parts and the heat-treating furnace.

A corrosive gas such as hydrochloric acid may be used as a reaction gas used for heat-treating of semiconductor wafers. In this case, if the waste gas leaks from between the process tube and the capping member and is diffused around the heat-treating furnace, the parts around the heat-treating furnace are corroded by the waste gas. Therefore, airtightness is required at a contact portion between the process tube and the capping member.

In order to prevent such gas leakage, an organic sealing member, such as rubber normally used for sealing, may be interposed in such a contact portion. However, since the process tube is heated to 1,100° C., an organic sealing member cannot be used for sealing.

For this reason, sealing between the process tube and the capping member is conventionally performed by fitting between these members Since both of the members are made of a hard heat-resistant material such as quartz, insufficient sealing may occur even by fitting. Therefore, the parts around the heat-treating furnace cannot be effectively protected against a corrosive gas.

SUMMARY OF THE INVENTION

The present invention has been made to eliminate the above-described drawbacks, and has as its object to provide a heat-treating apparatus in which a corrosive gas is not brought into contact with parts around an heat-treating furnace when an object to be heat-treated is heat-treated by introducing the corrosive gas into the furnace.

According to an aspect of the present invention, there is provided a heat-treating apparatus comprising:

a furnace, which includes a furnace body, for storing an object to be heat-treated, having an opening for allowing the object to be loaded therethrough, an inlet port for feeding a reaction gas, and an exhaust port for exhausting a waste gas, and heating means for heating the object;

capping means for capping the opening, for allowing the object to be loaded therethrough, of the furnace body before heat-treating;

sealing means for preventing the waste gas leaking from between the furnace body and the capping means from being diffused around the furnace; and gas exhaust means, coupled to the exhaust port, for introducing the waste gas outside the heat-treating apparatus.

According to another aspect of the present invention, there is provided a heat-treating apparatus comprising:

a furnace, which includes a furnace body, for storing an object to be heat-treated, having an opening for allowing the object to be loaded therethrough, an inlet port for feeding a reaction gas, and an exhaust port for exhausting a waste gas, and heating means for heating the object;

capping means for capping the opening, for allowing the object to be loaded therethrough, of the furnace body before heat-treating; and gas collecting means for collecting a waste gas exhausted from the exhaust port and a waste gas leaking from between the furnace body and the capping means so as to prevent the waste gas from being diffused around the furnace.

BRIEF DESCRIPTION OF THE DRAWINGS

FIG. 3 is a sectional view of a heat-treating apparatus according to a second embodiment of the present invention; and FIG. 4 is a view illustrating an exhaust system in the heat-treating apparatus of the second embodiment.

DETAILED DESCRIPTION OF THE PREFERRED EMBODIMENTS

Figure 1:
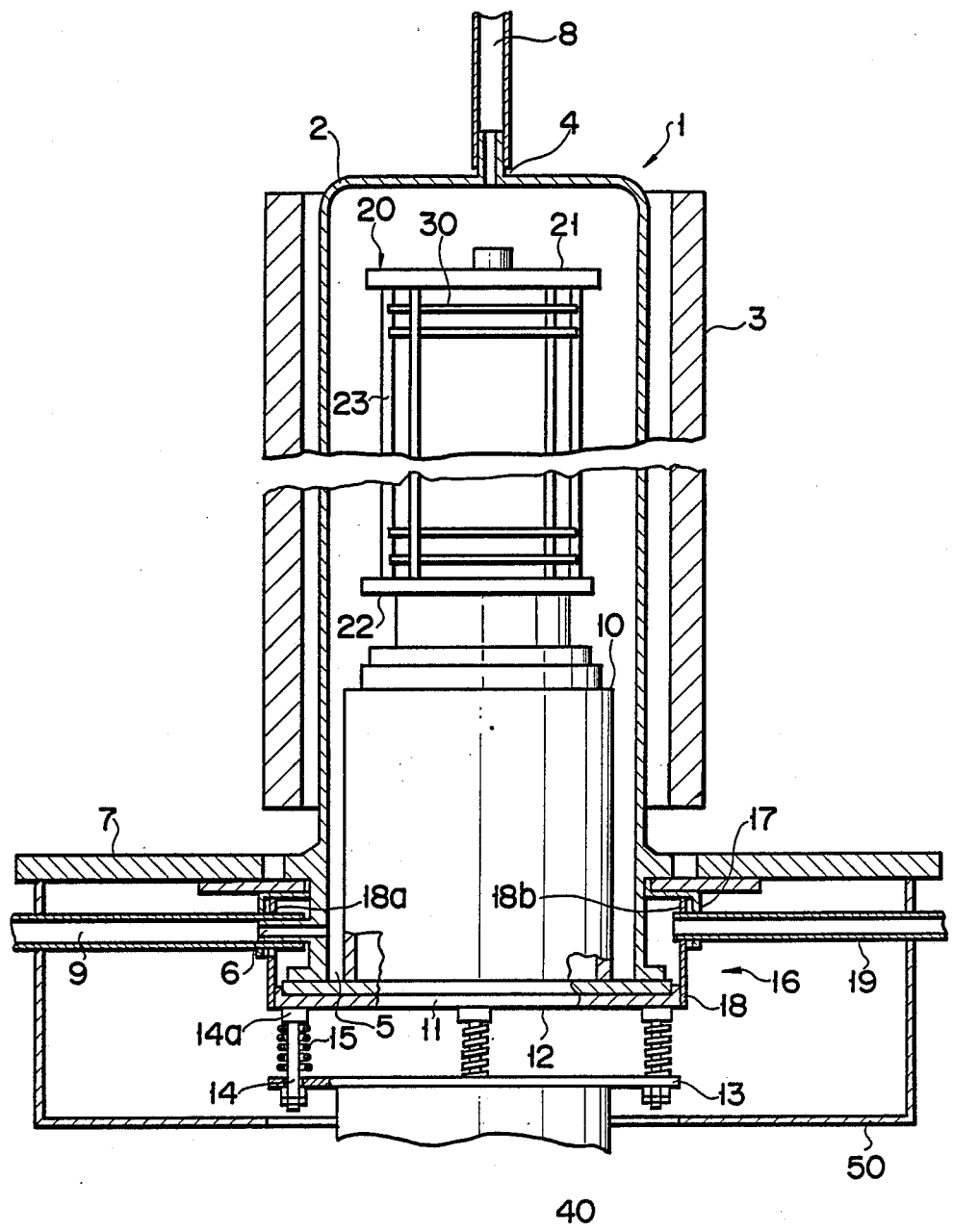
FIG. 1 is a sectional view of a heat-treating apparatus according to a first embodiment of the present invention.

Embodiments of the present invention will be described in detail below with reference to the accompanying drawings. FIG. 1 is a sectional view of a heat-treating apparatus according to the first embodiment of the present invention.

Vertical type heat-treating furnace 1 comprises process tube 2 arranged with its longitudinal direction vertically set, and cylindrical heater 3 arranged around tube 2. Process tube 2 is made of quartz. Opening 5 through which an object to be heat-treated is loaded/unloaded is formed in the lower end of tube 2, whereas inlet port 4 for feeding a reaction gas is formed in the upper end of tube 2. Process tube 2 is provided inside of heater 3 such that its lower portion extends lower than the lower end of heater 3, and is supported by base plate 7 arranged under heat-treating furnace 1. Inlet pipe 8 is connected to inlet port 4. A proper reaction gas is fed from a gas feeding unit (not shown) into process tube 2 through pipe 8 and inlet port 4. Exhaust nozzle 9 is externally fitted on exhaust port 6 so that the reaction gas fed in process tube 2 is exhausted from exhaust port 6 to the outside of the heat-treating apparatus through nozzle 9.

Heat-insulating cylinder 10 is made of quartz, and is used to support boat 20 on which semiconductor wafers 30 as objects to be heat-treated are mounted and to prevent dissipation of heat of furnace 1 when heat-treating is performed. Capping member 11 made of quartz is integrally formed on the lower end of cylinder 10. Capping member 11 is used to cap opening 5 of process tube 2, and is fitted with the lower end of process tube 2.

Boat 20 mounted on heat-insulating cylinder 10 comprises support members 21 and 22 on its upper and lower ends, and four support rods 23 extending in a direction perpendicular to support members 21 and 22 and coupling them to each other. Boat 20 is mounted on heat-insulating cylinder 10 with support rods 23 vertically set. A plurality of semiconductor wafers 30 as the objects to be heat-treated are respectively supported in a plurality of grooves formed in each support rod 23 at equal intervals.

Capping member 11 is fitted in metal reinforcement plate 12. Support plate 13 is arranged below reinforcement plate 12 so as to oppose it. A plurality of studs 14 are bolted in a periphery of support plate 13 along its circumferential direction. Heads 14a of studs 14 are fixed to plate 12, and compression springs 15 are arranged around studs 14 so as to be inserted between heads 14a and support plates 13, respectively. Capping member 1 is urged upward by the biasing forces of springs 15 so that capping member 11 is brought into tight contact at an area or contact with the lower end of process tube 2. Support plate 13 is supported by lifting arm 40 which is vertically moved by a lifting unit (not shown). Boat 20 and heat-insulating cylinder 10 are loaded/unloaded into/from process tube 2 by the lifting unit.

Metal case 16 is arranged below base plate 7 so as to surround an area including a contact portion between the lower end of tube 2 and capping member 11. Case 16 comprises upper and lower cases 17 and 18. Upper case 17 has a ring shape and surrounds the outer surface of tube 2. The upper surface of case 17 is fixed to the lower surface of base plate 7 by, e.g., screws. Lower case 18 is formed into a cylindrical shape having a diameter smaller than that of upper case 17. The lower end of case 18 is tightly fixed to the periphery of reinforcement plate 12 by, e.g., screws. The upper end of lower case 18 extends to the upper wall of upper case 17 while opening 5 is capped with capping member 11. That is, case 18 can surround an overall portion of process tube 2 below base plate 7 and the contact portion between capping member 11 and process tube 2.

If a waste gas leaks from the contact portion between tube 2 and capping member 11, upper and lower cases 17 and 18 temporarily store the leaked gas. The diameters of cases 17 and 18 are preferably set to minimum values necessary for such function. This arrangement is required to minimize the installation space of case 16 and keep the leaked gas near the outer surface of process tube 2 so as to prevent adverse affects due to diffusion of the gas.

Exhaust nozzle 9 described above extends outside the heat-treating apparatus through upper and lower cases 17 and 18. In addition, exhaust nozzle 19 is connected at a position opposite to exhaust nozzle 9 on the outer surface of upper case 17. One end of exhaust nozzle 19 reaches the inside of lower case 18, and the other end of nozzle 19 is connected to an exhaust fan (not shown). Notched portions 18a and 18b are formed in lower case 18 so as to retract nozzles 9 and 19, respectively, when boat 20 and heat-insulating cylinder 10 are lowered by the lifting unit.

Scavenger 50 is formed so as to surround case 16 below base plate 7. Scavenger 50 moves air surrounding process tube 2 heated by tube 2, which is heated to a high temperature in heat-treating, outside the heat-treating apparatus. An exhaust duct (not shown) is connected to scavenger 50.

An operation of the heat-treating apparatus arranged in this manner will be described below. In a state wherein boat 20 is not loaded, and only cylinder 10 is placed in process tube 2, lifting arm 40 is lowered by the lifting unit (not shown) until cylinder 10 is pulled out from below tube 2. In this case, lower case 18 is also lowered.

Boat 20 mounting semiconductor wafers 30 thereon is placed in heat-insulating cylinder 10, and boat 20 and cylinder 10 are loaded into process tube 2 by moving lifting arm 40. In this case, capping member 11 is brought into contact with the lower end of process tube 2, and opening 5 is capped. Upon this operation, lower case 18 is also moved upward to be combined with upper case 17, thereby constituting case 16.

Subsequently, semiconductor wafers 30 are heat-treated. In this heat-treating, heater 3 is heated by supplying a power from a power supply (not shown) to heater 3, and semiconductor wafers 30 are heated by heater 3. While heat-treating is performed in this manner, a reaction gas is fed from the gas feeding unit (not shown) to process tube 2 through pipe 8 and inlet part 5, and the gas is exhausted outside the heat-treating apparatus from exhaust port 6 through exhaust nozzle 9.

Process tube 2 and capping member 11 are in contact with each other by fitting. However, since both of them are made of quartz, airtightness may be insufficient. In such a case, the waste gas leaks from gaps between process tube 2 and capping member 11 to the outside of process tube 2. In this embodiment, since the contact portion between tube 2 and capping member 11 is surrounded by case 16, the gas leaking from the gaps is collected in case 16. The gas which has leaked in case 16 is exhausted outside the heat-treating apparatus through nozzle 19. Therefore, this arrangement can prevent the gas leaking from the gaps from being diffused around process tube 2. Especially when a corrosive gas such as hydrochloric acid is used as a reaction gas, this arrangement is effective in protecting the parts arranged around process tube 2, such as the lifting unit, against corrosion which is caused when the gas is brought into contact with them.

Figure 2:
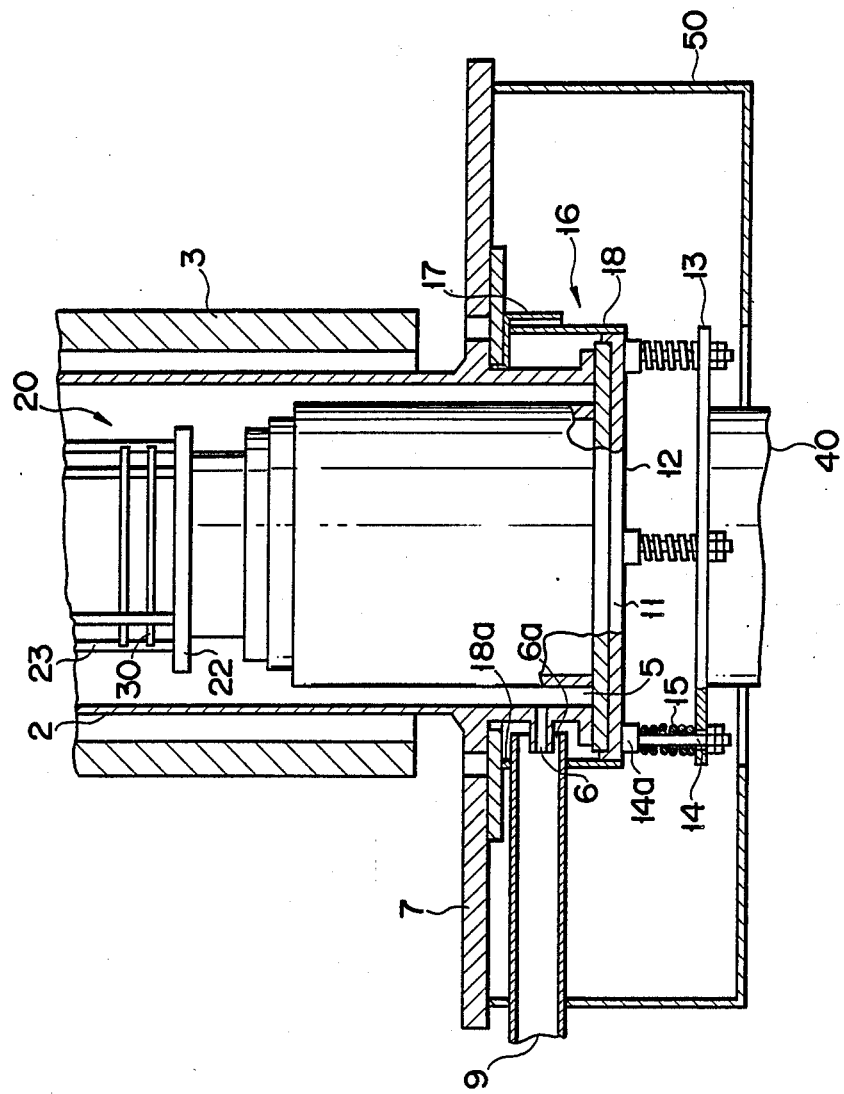
FIG. 2 is a sectional view showing a modification of the heat-treating apparatus shown in FIG. 1.

According to the above-described arrangement, the gas leaking into case 16 is exhausted through exhaust nozzle 19. However, an arrangement shown in FIG. 2 may be employed.

More specifically, the inner diameter of exhaust nozzle 9 is made larger than the outer diameter of exhaust port 6, and gap 6a is formed in a connecting portion of nozzle 9 and port 6. In such a state, when a waste gas from process tube 2 is exhausted from exhaust port 6, a suction force is generated at the end of exhaust nozzle 9 on the side of process tube 2. Consequently, the gas leaking from the gap between tube 2 and capping member 11 is exhausted outside the annealer through gap 21 and exhaust nozzle 9 because of this suction force. With this arrangement, exhaust nozzle 19 shown in FIG. 1 can be omitted. Note that the same reference numerals in FIG. 2 denote the same parts as in FIG. 1.

A second embodiment of the present invention will be described below. FIG. 3 is a sectional view of a heat-treating apparatus according to the second embodiment of the present invention. FIG. 4 is a view illustrating a waste gas collecting system in the heat-treating apparatus. The same reference numerals in FIGS. 3 and 4 denote the same parts as in FIG. 1, and a description thereof will be omitted. Exhaust nozzle 61 integrally formed with process tube 2 is connected to exhaust port 6 of process tube 2. Quartz nozzle 62 is coupled to nozzle 61 as an exhaust portion. Coupling portion 63 for nozzles 61 and 62 has a ball joint structure so as to provide a good seal.

Gas collecting case 64 is arranged in scavenger 50 so as to cover quartz nozzle 62, and collects a waste gas exhausted from process tube 2 through exhaust port 6 and nozzles 61 and 62

Ring-like gas collecting hood 65 is arranged outside process tube 2 so as to cover the contact portion between tube 2 and capping member 11. Hood 65 is made up of upper and lower hood components 65a and 65b, and lower hood component 65b is fixed to plate 12. Upper and lower hood components 65a and 65b are separatable from each other at the portion indicated by "A" in FIG. 3. When boat 20 is unloaded, lower hood component 65b is lowered, together with boat 20 and cylinder 10. When boat 20 is loaded, lower hood component 65b is raised and is brought into tight contact with upper hood component 65a. When upper and lower hood components 65a and 65b are in tight contact with each other, a gas leaking from the contact portion between tube 2 and capping member 11 can be prevented from being diffused outside.

Gas collecting case 64 and hood 65 are coupled to each other by coupling pipe 66. One end of coupling pipe 66 is inserted in case 64, and a waste gas collected by hood 65 is introduced into case 64 through coupling pipe 66. Case 64, hood 65, and coupling pipe 66 have been subjected to a surface treatment so as to allow their surfaces to hold resistance to a corrosive gas such as hydrochloric acid.

Exhaust port 67 is formed in gas collecting case 64. Exhaust pipe 68 is coupled to exhaust port 67. The waste gas in case 64 is introduced to a waste gas combustion unit (not shown) or the like. Note that quartz nozzle 62 is supported by support member 69 in gas collecting case 64.

In such an heat-treating apparatus, a waste gas leaking from between process tube 2 and capping member 11 is collected by hood 65, and is recovered in case 64 together with a waste gas exhausted from quartz nozzle 62. Subsequently, the waste gas in case 64 is introduced from exhaust port 67 to the combustion unit or the like outside the heat-treating apparatus through exhaust port 67 and exhaust pipe 68. Similar to the first embodiment, this arrangement can prevent the waste gas leaking from between process tube 2 and capping member 11 from being diffused around tube 2. Especially when a corrosive gas, such as hydrochrolic acid, is used as a reaction gas, this arrangement is effective in preventing contact of the gas with the parts arranged around process tube 2, such as the lifting unit so as to protect them against corrosion. Therefore, accidents due to corrosion can be prevented. In addition, even if gas collecting case 64 and hood 65, and coupling pipe 66 are corroded, they can be replaced with new ones. This prevents corrosion of the overall heat-treating apparatus, and prolongs its service life, thereby realizing an inexpensive countermeasure against corrosion.

Note that the present invention is not limited to the above two embodiments. Various changes and modifications can be made within the spirit and scope of the invention. In the embodiments, the heat-treating apparatus for wafers are exemplified. However, the present invention is not limited to this, and can be applied to any apparatus for performing heat-treating by feeding a reaction gas. Furthermore, the present invention is not limited to the vertical type furnaces described in the embodiments, but can be also applied to a heat-treating apparatus employing a horizontal type furnace.

Although the scavengers are arranged in the above-described embodiments, they are not necessarily required.

What is claimed is:

1. A heat-treating apparatus comprising:
    a furnace, which includes a furnace body, for storing an object to be heat-treated, having an opening for allowing the object to be loaded therethrough, an inlet port for feeding a reaction gas, and an exhaust port for exhausting a waste gas, and heating means for heating the object;
    capping means positionable for making tight contact with said furnace body at an area of contact for capping said opening, said capping means being separable from said opening for allowing the object to be loaded therethrough before heat treating;
    sealing means forming an enclosed volume around said area of contact for preventing the waste gas leaking from between said furnace body and said capping means from being diffused around said furnace; and
    gas exhaust means, coupled to said exhaust port, for introducing the waste gas including the waste gas leaked into said enclosed volume, outside said heat-treating apparatus.

2. An apparatus according to claim 1, wherein said sealing means includes a casing member for covering a portion between said furnace body and said capping means, and leaking gas exhaust means, connected to said casing member, for introducing the waste gas leaking from between said furnace body and said capping means to the outside of said heat-treating apparatus.

3. An apparatus according to claim 2 wherein said leaking gas exhaust means includes a leaking gas exhaust nozzle allowing the leaked gas to flow therethrough.

4. An apparatus according to claim 1, wherein said gas exhaust means includes a waste gas exhaust nozzle for allowing the gas from said exhaust port to flow therethrough.

5. An apparatus according to claim 4, wherein a gap is formed between said exhaust port and said waste gas exhaust nozzle, said sealing means includes a casing member which covers a portion between said furnace body and said capping means and is coupled to said waste gas exhaust nozzle, and the gas leaking from between said furnace body and said capping means is drawn by suction to said waste gas exhaust nozzle from said gap between said exhaust port and said waste gas exhaust nozzle.

6. An apparatus according to claim 1, wherein said furnace body is arranged so as to set a longitudinal direction thereof vertically, and said opening for allowing the object to be loaded therethrough is formed in a lower end of said furnace body.

7. An apparatus according to claim 1, including gas collecting means for collecting waste gas exhausted from said exhaust port and waste gas from said enclosed volume, so as to prevent the waste gas from being diffused around said furnace.

8. An apparatus according to claim 7, wherein said gas collecting means includes a gas collecting member for collecting the waste gas exhausted from said exhaust port, and a coupling pipe for coupling said enclosed volume to said gas collecting member.

9. An apparatus according to claim 8, wherein said gas collecting member includes an exhaust pipe for introducing the collected gas to the outside of said heat-treating apparatus.

10. An apparatus according to claim 7, wherein said furnace body is arranged so as to set a longitudinal direction thereof vertically, and said opening for allowing the object to be loaded therethrough is formed in a lower end of said furnace body.

* * * * *